July 7, 1970 J. L. McLAUGHLIN 3,519,348

PHOTOMASKS FOR FABRICATION OF SEMICONDUCTOR DEVICES

Filed May 28, 1968

INVENTOR
JOSEPH L. McLAUGHLIN

BY M. G. Epstein
ATTORNEY

United States Patent Office 3,519,348

Patented July 7, 1970

3,519,348

PHOTOMASKS FOR FABRICATION OF SEMICONDUCTOR DEVICES

Joseph L. McLaughlin, Flemington, N.J., assignor to RCA Corporation, a corporation of Delaware Filed May 28, 1968, Ser. No. 732,669
Int. Cl. G03b *27/28*
U.S. Cl. 355—133 4 Claims

ABSTRACT OF THE DISCLOSURE

To prevent contact of the image elements on a surface of a photomask with the photosensitive surface of a semiconductor wafer, for the purpose of preventing scratching of the image elements, the photomask surface is provided with spacer elements which extend further from the surface than the image elements. In the use of the photomask, only the spacer elements contact the wafer surface.

BACKGROUND OF THE INVENTION

This invention relates to the fabrication of semi-conductor devices, and particularly to the photomasks used in such fabrication.

In the photolithographic processes used in the fabrication of certain types of semiconductor devices, e.g., integrated circuits, a photomask having opaque image elements on a surface thereof is placed in contact with a photosensitive surface of a semiconductor wafer. This is referred to as "contact" printing. A problem associated with such contact printing is that the wafer surface is not perfectly flat, but generally contains sharp and hard projections or spikes. The wafer spikes scratch the mask image elements, and after a relatively few uses of the mask, damage the mask to the point where it must be discarded. The cost of preparing photomasks represents a significant factor in the total cost of fabricating semiconductor devices.

To prevent scratching of the photomasks by the wafer spikes, it has been suggested to maintain the photomask at a fixed distance from the surface of the wafer. This is referred to as "projection" printing. It is found, however, that for obtaining uniform results, from wafer to wafer, and from printing to printing operation, the spacing between the photomask surface and the wafer surface must be accurately reproducible. Various methods have been proposed for providing uniform and accurately controllable spacings between the photomask and the wafer surface, but such methods have generally been unsatisfactory as being excessively cumbersome, expensive, and inaccurate.

SUMMARY OF THE INVENTION

A photomask is provided having an opaque image element on a portion of one surface of the photomask. Elsewhere on the surface is a raised spacer which projects further from the surface than the image element. Using known means, such as by evaporation through a mask, the thickness of the spacer can be carefully controlled.

In the use of the photomask, the spacer maintains the image element out of contact with the wafer, and provides a highly accurate and reproducible spacing of the image element from the wafer surface.

DESCRIPTION OF PREFERRED EMBODIMENTS OF THE INVENTION

Figure 1:
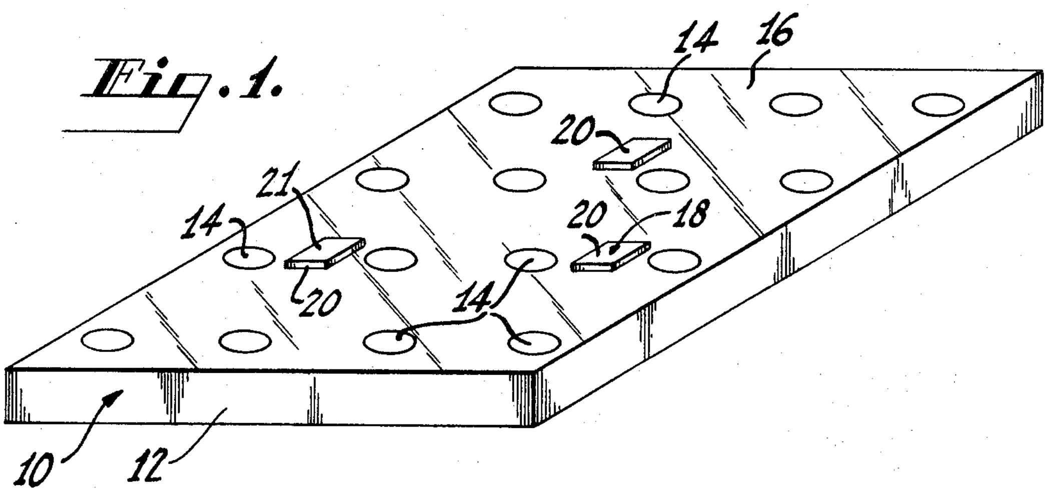
FIG. 1 is a view in perspective of a photomask in accordance with the present invention.

With reference to FIG. 1, a photomask 10 is shown comprising a transparent substrate 12, e.g., of glass, having a plurality of image elements 14 on one flat surface 16 of the substrate. As shown, the image elements 14 are arranged in rows and columns on the substrate 12. In this embodiment, each element 14 comprises a single opaque circle of a known opaque material such as a photographic emulsion, a metal, such as chrome, or the like. Alternately, although not shown, each image element can comprise an opaque substance located within a depression or well, formed by etching, sandblasting, or the like, in the surface 16. An explanation of the function of the image elements with respect to the fabrication of a semiconductor device is not given, since the use of photomasks is well known.

For the purpose of preventing the image elements from coming into contact with surface irregularities of the wafer, such as extending spikes, and thus being scratched, the photomask 10 is provided with a spacer 18 on the surface 16 of the substrate 12, the spacer 18 projecting further from the substrate surface 12 than the image elements 14.

In a preferred embodiment, as shown in FIG. 1, the spacer 18 comprises three generally rectangular pads 20 which are disposed in an equilateral triangular array. The upper surfaces 21 of the pads are generally flat and parallel to the substrate surface 16. Alternately, although not shown, the pads 20 can comprise generally hemispherical dots of uniform height. In this embodiment, the image elements 14 comprise a deposition of chrome having a thickness in the order of 1,000 angstroms, and the spacer pads 20 comprise a deposition of aluminum having a uniform height or "projection" from the substrate surface of 0.6 mil.

In the use of the photomask 10, the photomask is placed, image surface 16 down, in contact with the flat photosensitive surface of a wafer. Because of the greater thickness, "or projection" of the spacer pads 20, the only portions of the photomask which make contact with the wafer surface are the spacer pads 20. The three pads of equal thickness maintain the photomask parallel to the wafer. The spacing between the image elements and the wafer surface is, for all practical purposes, equal to the thickness of the spacer pads 20.

Although not necessary, in the practice of "projection" printing it is generally preferrable to use a highly collimated light source to expose the wafer photosensitive surface through the photomask. Also, best results are obtained if the photomask image surface 16 is absolutely perpendicular to the exposing light beam.

Figure 2:
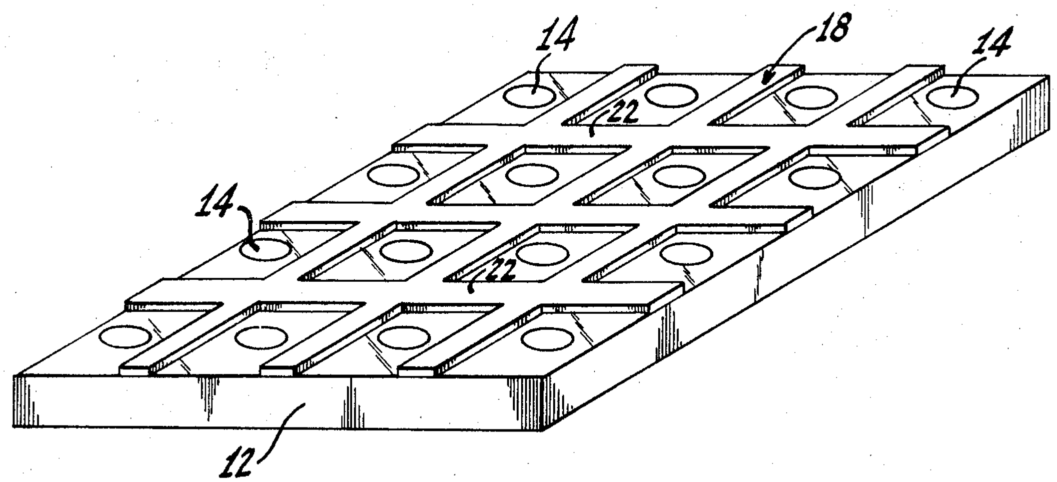
FIG. 2 is a view in perspective of another embodiment of the invention.

With reference to FIG. 2, the spacer 18 in this embodiment comprises a grid of orthogonal lines 22 of uniform thickness disposed between the image elements 14. In this arrangement, the spacer lines 22 overlie, during the printing operation, the portions of the wafers which are later scribed for the purpose of dicing the wafer, as known. Accordingly, little wafer surface is made unavailable for printing by the presence of the spacer lines 22.

In each instance, the protective spacers space the image elements from contact with the wafer, thereby preventing scratching of the image elements, and provide an accurate and reproducible spacing of the image elements from the wafer surface. Although the protective spacers may become scratched in the use of the photomasks, the scratches on the spacers have no affect upon the devices being printed on the wafer.

In the fabrication of photomasks of the type described, the substrate 12 having the image elements 14 thereon can be fabricated in any of various known ways. A convenient means of applying the spacers 18 is by metal evaporation through a suitable mask. A preferred material for the spacers 18 is aluminum owing to the ease with which a thick layer of aluminum can be adherently deposited onto a glass substrate. Other metals, such as copper and nickel, for example, can be used by first applying a thin layer of gold on the substrate surface to be covered by the spacer 18, and electroplating the metal to the desired thickness onto the gold layer.

What is claimed is:

1. A photomask comprising a transparent substrate, an array of opaque image elements on portions of a surface of said substrate, and a plurality of spacers on other portions of said surface, said spacers having a thickness greater than said image elements, the thicknesses of said spacers being equal to each other.

2. A photomask as in claim 1 wherein said substrate surface is flat, and each of said spacers has a surface parallel to said substrate surface, thereby providing means for accurately spacing said image elements a preselected distance from a flat surface placed in contact with said spacers.

3. A photomask as in claim 1 wherein said image elements comprise depositions of chrome, and said spacers comprise depositions of aluminum.

4. A photomask as in claim 1 wherein said image elements are in spaced relation on said substrate surface, and said spacers comprise a network of lines extending between said elements.

References Cited

UNITED STATES PATENTS 3,204,544 9/1965 Shannon ----------- 355—133

NORTON ANSHER, Primary Examiner

M. GELLNER, Assistant Examiner

U.S. Cl. X.R.

355—125